(12) United States Patent
Desai et al.

(10) Patent No.: US 7,629,559 B2
(45) Date of Patent: Dec. 8, 2009

(54) METHOD OF IMPROVING ELECTRICAL CONNECTIONS IN CIRCUITIZED SUBSTRATES

(75) Inventors: Subahu D. Desai, Vestal, NY (US); John M. Lauffer, Waverly, NY (US); How T. Lin, Vestal, NY (US); Voya R. Markovich, Endwell, NY (US); Ronald V. Smith, Friendsville, PA (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 699 days.

(21) Appl. No.: 11/305,073

(22) Filed: Dec. 19, 2005

(65) Prior Publication Data

US 2007/0139977 A1 Jun. 21, 2007

(51) Int. Cl.
*H05B 1/02* (2006.01)
(52) U.S. Cl. .................. 219/507; 219/508; 219/505; 174/255; 156/273.9; 361/794
(58) Field of Classification Search ................ 219/494, 219/497, 501, 505, 507–509; 174/255, 262; 361/780, 794; 156/244.17, 233, 252, 272.2, 156/273.9
See application file for complete search history.

(56) References Cited

U.S. PATENT DOCUMENTS

| | | | |
|---|---|---|---|
| 5,817,404 A | 10/1998 | Kawakita et al. | |
| 5,891,283 A | 4/1999 | Tani et al. | |
| 5,925,930 A * | 7/1999 | Farnworth et al. | 257/737 |
| 5,956,843 A | 9/1999 | Mizumoto et al. | |
| 6,120,708 A | 9/2000 | Ohshita et al. | |
| 6,143,116 A * | 11/2000 | Hayashi et al. | 156/233 |
| 6,388,204 B1 | 5/2002 | Lauffer et al. | |
| 6,479,093 B2 | 11/2002 | Lauffer et al. | |
| 6,593,534 B2 | 7/2003 | Jones et al. | |
| 6,641,898 B2 | 11/2003 | Yazaki et al. | |
| 6,762,496 B2 | 7/2004 | Yamamoto et al. | |
| 6,809,269 B2 | 10/2004 | Fuller, Jr. et al. | |
| 6,828,514 B2 | 12/2004 | Chan et al. | |
| 2002/0050586 A1 | 5/2002 | Oshita et al. | |

* cited by examiner

*Primary Examiner*—Mark H Paschall
(74) *Attorney, Agent, or Firm*—Hinman, Howard & Kattell; Lawrence R. Fraley; Mark Levy

(57) ABSTRACT

A method of improving conductive paste connections in a circuitized substrate in which at least one and preferably a series of high voltage pulses are applied across the paste and at least one and preferably a series of high current pulses are applied, both series of pulses applied separately. The result is an increase in the number of conductive paths through the paste connections from those present prior to the pulse applications and a corresponding resistance reduction in said connections.

16 Claims, 1 Drawing Sheet

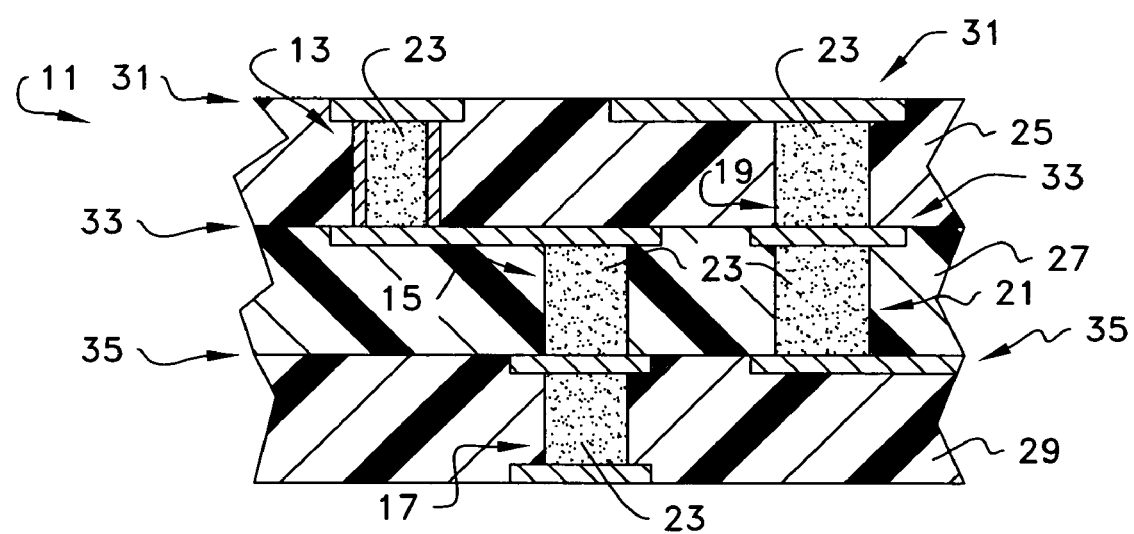

METHOD OF IMPROVING ELECTRICAL CONNECTIONS IN CIRCUITIZED SUBSTRATES

TECHNICAL FIELD

This invention relates to circuitized substrates and particularly organic circuitized substrates in which conductive paste is used to form electrical connections therein. More specifically, the invention relates to methods of improving such paste connections.

BACKGROUND OF THE INVENTION

Printed circuit boards (also referred to herein as PCBs), laminate chip carriers, and the like organic products permit formation of multiple circuits in a minimum volume or space. These structures are known to comprise a "stack" of electrically conductive layers of signal, ground and/or power planes (lines) separated from each other by a layer of organic dielectric material. Selected ones of the lines in one layer are often in electrical contact with corresponding selected ones in one or more other layers by plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness. By the term "thru-hole" as used herein is thus meant to include all three types of such board openings.

Methods for making such PCBs, chip carriers and the like typically comprise fabrication of separate inner-layer circuits (circuitized layers), which are formed by coating a photosensitive layer or film over a metal (usually copper or copper alloy) layer on a dielectric "base" layer. The organic photosensitive coating is imaged, developed and the exposed copper is etched to form the desired circuit, e.g., a pattern of conductor lines, pads, etc. After etching, the photosensitive film is stripped from the copper, leaving the circuit pattern on the surface of the base layer. This methodology is also referred to as photolithographic processing in the PCB art and further description is not deemed necessary. Following the formation of individual circuit layers (some including circuitry on opposite sides of the dielectric), a multilayer "stack" is formed by preparing a lay-up of these formed inner-layers, ground planes, power planes, etc., typically separated from each other by the mentioned dielectric, organic pre-preg material typically comprising a layer of glass cloth (usually fiberglass) impregnated with a partially cured material, one common example referred to as a "B-stage" epoxy resin. Such an organic material is also referred to in the industry as "FR-4" dielectric material. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The final stack so formed thus has the metal cladding on at least its upper surface but this cladding may also be positioned on the bottom or undersurface of the stacked structure. Exterior circuit layers are then usually formed in the copper cladding using photolithographic procedures similar to the procedures used to form the inner-layer circuits. That is, a photosensitive film is applied to the copper cladding, exposed to pattern activating radiation and developed. An etching solution such as cupric chloride is then used to remove copper bared by the development of the photosensitive film. Finally, the remaining photosensitive film is removed to provide the exterior circuit layers. Elements of such layers, e.g., conductive pads, may be used then to have electrical components mounted thereon. One such example of an electrical component is a chip carrier, or even a single semiconductor chip, both of which may be mounted on the external pads using solder balls or some other known process, e.g., wire-bonding. If the structure so formed is to serve as a chip carrier, e.g., having one or more chips mounted on one surface, the pads on the undersurface may serve as connecting pads for appropriate conductors, e.g., solder balls, which may couple the carrier and its chip(s) to a designated underlying circuitized substrate, typically a multilayered PCB.

It is known in the art to use thru-holes of the above type to electrically connect various individual circuit layers within the structure, as well as to the aforementioned outer conductive surface(s). As mentioned, such thru-holes may pass through only parts of the stacked substrate and may also be "buried" or hidden therein. Such thru-holes may be formed prior to the formation of circuits on the exterior surfaces by drilling holes through the stack at appropriate locations. For internally positioned thru-holes, such holes are usually formed within the individual circuitized layers prior to incorporation within the multi-layered structure and final lamination thereof. In both methods, the bare hole walls are usually subjected to at least one pre-treatment step after which the walls are catalyzed by contact with a plating catalyst and metallized, typically by contact with an electro-less or electrolytic copper plating solution. If the thru-holes are PTHS, interconnections are thus formed between selected ones of the circuitized layers of the multilayered final product which have one or more conductive lines or elements in contact with the inner conductive layer of the PTHS. If the thru-holes are individually formed within selected layers and then coupled to one another during product stacking, connectivity may be accomplished using a conductive paste or the like. Such pastes are known to include a conductive metal such as silver in the form of flakes. Following formation of the conductive thru-holes in multilayered structures such as PCBS in which the thru-holes are provided as PTHS, the aforementioned exterior circuits (outer-layers) are formed. Such external formation may also occur when stacking layers already having thru-holes formed therein, albeit it is possible to form the two outer conductive layers prior to stacking and lamination. When external components are mounted on the substrate and coupled to the external conductors, e.g., pads, thereon, it is thus seen that said components are then capable of being electrically coupled to other such components through the substrate's internal circuitry.

Electrical testing of such formed substrates which utilize conductive paste as the coupling medium (either alone or in combination with plating on the inner walls of formed openings) involves testing resistances of the various circuit paths across (through) the paste. Such testing is obviously very important considering the thousands of circuits often contained within complex substrates of the type being produced today. Failure of just one circuit path may in turn necessitate scrapping or costly repair of the substrate, obviously a result which manufacturers wish to avoid. On some occasions, the resistance of one or more connections may be considered relatively high, and thus unacceptable. As defined in greater detail herein-below, the present invention provides a method of improving such paste connections in the finally bonded (e.g., laminated) multilayer structure having many such internal connections therein in a facile and non-destructive manner. Such a method is considered a significant advancement in the art.

Examples of various multilayer substrates, including some which utilize conductive paste for interconnections, are described below.

In U.S. Pat. No. 6,828,514, issued Dec. 7, 2004, there is defined a multilayered PCB including two multilayered portions, one of these able to electrically connect electronic components mounted on the PCB to assure high frequency connections there-between. The PCB further includes a conventional PCB portion to reduce costs while assuring a structure having a satisfactory overall thickness for use in the PCB field. Coupling is also possible to the internal portion from these components. This patent is assigned to the same Assignee as the instant invention.

In U.S. Pat. No. 6,809,269, issued Oct. 26, 2004, there is defined a circuitized substrate assembly and method for making same wherein the assembly includes individual circuitized substrates bonded together. The substrates each include at least one opening, one of which is substantially filled with a conductive paste prior to bonding. Once bonded, the paste is also partially located within the other opening to provide an effective electrical connection therewith. One example of a product using this technology is a chip carrier. This patent is also assigned to the same Assignee as the instant invention.

In U.S. Pat. No. 6,762,496, issued Jul. 13, 2004, there is described a sintered aluminum nitride substrate which has a "via" hole and an internal electrically conductive layer with, allegedly, high thermal conductivity and high adhesion strength between the sintered aluminum nitride substrate and the internal electrically conductive layer or the via hole. The substrate consists of an internal electrically conductive layer, at least one electrically conductive via hole formed between the internal electrically conductive layer and at least one surface of the substrate, wherein the thermal conductivity of the aluminum nitride sintering product at 25 degrees Celsius (C.) is described as being 190 W/mK or more, with a corresponding adhesion strength between the aluminum nitride sintering product and the internal electrically conductive layer also mentioned.

In U.S. Pat. No. 6,641,898, issued Nov. 4, 2003, there is described a heated and pressed printed wiring board which is made by filling "via" holes formed in layers of insulating film of the wiring board with an interlayer conducting material. The insulating film is stacked with conductor patterns, and each conductor pattern closes a hole. The interlayer conducting material forms a solid conducting material in the holes after a heating and pressing operation. The solid conducting material includes two types of conducting materials, the first type being a metal and the second type including an alloy formed by the metal and conductor metal of the conductor patterns. The first type of conducting material includes indium particles, tin and silver, wherein tin accounts for approximately 20-80 weight percentage of the solid conductive material, and the second type of conducting material includes an alloy comprised of the solid conductive material and the conductor metal. The conductor patterns are electrically connected reliably without relying on mere mechanical contact.

In U.S. Pat. No. 6,593,534, issued Jul. 15, 2003, there is described a method for producing a multilayer printed or wiring circuit board, and more particularly a method producing so-called z-axis or multilayer electrical interconnections in a wiring structure in order to be able to provide for an increase in the number of inputs and outputs (I/O) in comparison with a standard printed wiring board (PWB, this being an alternative term for a PCB) arrangement, and a printed wiring board produced by the method. The thru-holes of the structure are filled with conductive paste.

In U.S. Pat. No. 6,479,093, issued Nov. 12, 2002, there is described a laminate circuit structure assembly that comprises at least two modularized circuitized plane subassemblies and a joining layer located between each of the subassemblies wherein the subassemblies and joining layer are bonded together with a cured dielectric. The subassemblies and joining layer are electrically interconnected with bondable electrically conductive material. The joining layer comprises dielectric layers disposed about an internal electrically conductive layer. The electrically conductive layer has a via and the dielectric layers each have a via of smaller diameter than the vias in the electrically conductive layer and are aligned with the vias in the electrically conductive layer. The vias are filled with electrically bondable electrically conductive material for providing electrical contact between the subassemblies.

U.S. Pat. No. 6,388,204, issued May 14, 2002, is the parent of U.S. Pat. No. 6,479,093, and describes similar structures and processes.

In Published Patent Application 2002/0050586, issued May 2, 2002, there is described an electro-conductive paste for use in making ceramic substrates containing from about 5 to 18 percent by weight of an organic vehicle consisting of a solvent and a binder, from about 80 to 93 percent by weight of an electro-conductive metal powder in a spherical or granular shape and with a particle diameter in the range of about 0.1 to 50 microns, and from about 2 to 10 percent by weight of a resin powder with a particle diameter in the range of about 0.1 to 50 microns which is insoluble in the solvent and has a low level of water absorption. This paste may be used for forming via hole conductors to be converted to external electrode terminals for the resulting ceramic products.

In U.S. Pat. No. 6,143,116, issued Nov. 7, 2000, there is described a multilayer wiring board formed by laminating a plurality of circuit board "units" each including an insulating board containing at least a thermosetting resin, and a wiring circuit layer formed on the surface of the insulating board, wherein the board is provided with via hole conducting passages so as to electrically connect the wiring circuit layers of the neighboring circuit board units. The via hole conducting passages are filled with a conducting paste, the wiring circuit layer buried in the surface of the board in a manner that the possesses a flat surface for mounting flip chips. This patent mentions in column 11 that resistance of the conducting passages can be further decreased through application of a pulse current to the via hole connections, resulting in a "welding" of the metal particles of the conductive paste.

In U.S. Pat. No. 6,120,708, issued Sep. 19, 2000, there is described a conductive paste for forming via-holes in a ceramic substrate, which paste contains about 80-94 weight percentage spherical or granular conductive metal powder having a particle size of about 0.1-50 microns, 1-10 weight percentage resin powder which swells in a solvent contained in the conductive paste and has a particle size of about 0.1-40 microns, and about 5-19 weight percentage of an organic vehicle. The paste is described as hardly generating cracks during firing to thereby attain excellent reliability in electric conduction and which can provide a via-hole or through hole having excellent solderability and platability in a ceramic substrate structure.

In U.S. Pat. No. 5,956,843, issued Sep. 28, 1999, there is described a multilayer printed wiring board and method of making thereof, in which a substrate constitutes a plurality of dielectric layers having electrically connecting components formed on the surfaces thereof so as to be either arranged externally or internally intermediate adjacent layers, and which are provided with vertically aligned through-holes or vias communicating between adjacent layers. Each of the holes may be equipped with electrically conductive plated layers or similar structures covering the surfaces of the holes or vias, and a conductive or non-conductive material, such as in the form of a paste, may be filled into each plated hole.

In U.S. Pat. No. 5,891,283, issued Apr. 6, 1999, there is described a conductive paste for use in forming ceramic substrates in which the composition consists of an organic vehicle, copper powder and an organo-metallic resinate which includes, as the metal, at least one metal selected from the group consisting of Pt, Ni and Bi. The amount of the metal component in the organo-metallic resinate is in the range of about 0.1 to 5 weight percentage with respect to the total amount of the copper power and the metal component. The copper powder has preferably an average diameter in the range of about 2 to 30 microns.

In U.S. Pat. No. 5,817,404, issued Oct. 6, 1998, there is described a printed circuit board in which electrode layers can electrically be connected by an inner-through-hole connection. A cover film is laminated on both surfaces of a resin impregnated fabric sheet, holes are formed by laser beams in the direction of the thickness of the sheet and cover film, and an electrically conductive paste that contains the electrically conductive particles and a thermosetting resin is filled in the holes. The cover film is removed, a copper foil is placed on both sides of the sheet, and pressed and heated, and the resin component of the sheet and that of the electrically conductive paste are hardened. The copper foil is etched to form circuit patterns, and further etching removes the electrically conductive particles present at a surface layer portion so that an electrical insulating layer is thus formed.

The relative complexity of the above organic products (those including organic dielectric layers, including the aforementioned PCBs and laminate chip carriers) has increased significantly over the past few years, especially as such products increase in demand over those of the earlier ceramic variety. For example, PCBs for mainframe computers may have as many as thirty-six layers of circuitry or more, with the complete stack having a thickness of as much as about 0.250 inch (250 mils). Laminate chip carriers, in turn, may have as many as fifteen circuit layers as part thereof. Such organic products are known with three or five mil (a mil being one thousandth of an inch) wide signal lines and twelve mil diameter thru-holes, but for increased circuit densification in many of today's products, the industry is attempting to reduce signal lines to a width of two mils or less and thru-hole diameters to two mils or less. Such high densification understandably mandates the most efficient means of interconnecting the respective layers in the smallest space available and using the best materials possible. As defined herein, the present invention is able to assure that such connections of the conductive paste type will possess the proper resistance levels and thus meet the stringent requirements demanded of today's substrates.

As stated, it is believed that a method of improving the conductive paste connections in formed circuitized substrates in a facile manner such that these connections will each possess an optimum, desired resistance level for such substrates, including those having highly dense circuitry, will constitute a significant advancement in the art.

OBJECTS AND SUMMARY OF THE INVENTION

It is, therefore, a primary object of the invention to enhance the circuitized substrate art.

It is another object of the invention to provide a method of improving electrical connections in formed circuitized substrates in an effective manner, so as to assure that all of the substrate's connections will meet stringent operational requirements.

It is a further object of this invention to provide such a method which can be conducted in a facile manner, using conventional equipment, thereby reducing the costs of such a method.

According to one aspect of the invention, there is provided a method of improving an electrical connection within a circuitized substrate wherein the electrical connection includes conductive paste as a conductive medium, the method comprising applying a high voltage pulse across the conductive paste of the electrical connection and applying a high current pulse across the conductive paste of the electrical connection, the high voltage and high current pulses being applied separately.

BRIEF DESCRIPTION OF THE DRAWING

The drawing is an elevational view, in section, of a circuitized substrate including a plurality of thru-holes therein each including conductive paste.

BEST MODE FOR CARRYING OUT THE INVENTION

For a better understanding of the present invention, together with other and further objects, advantages and capabilities thereof, reference is made to the following disclosure and appended claims in connection with the above-described drawing.

By the term "circuitized substrate" as used herein is meant to include a substrate having at least two separate conductive layers with a corresponding amount of dielectric material isolating these from one another wherein the at least two conductive layers are interconnected by at least one (and preferably several) thru-hole(s) having conductive paste therein. Known examples of substrates include dielectric materials such as fiberglass-reinforced epoxy resin (often referred to in the industry as, simply, "FR-4"), polytetrafluoroethylene (PTFE), polyimide, polyamide, cyanate resin, photo-imageable material, and other like materials. One more specific example of such material known today is sold under the trade name "RO2800" dielectric material, Rogers Corporation of Rogers, Conn. "RO2800" is a polytetrafluoroethylene composite material having a low dielectric constant and includes fused silica as one of the composition elements. It is rated with 0% water solubility and has a specific gravity of 2.1. Such substrates, as mentioned above, may have as many as thirty-six conductive layers of circuitry or more, with the complete stack having a thickness of as much as about 0.250 inch (250 mils). The conductive layers used in such substrates are each typically comprised of a metal such as copper or copper alloy, but may include or comprise additional metals (e.g., nickel, aluminum, etc.) or alloys thereof.

By the term "conductive paste" as used herein is meant an electrically conductive paste composition adapted for use in holes or openings of substrates and between conductive members (e.g., pads) of such substrates to provide an electrical path between two or more such conductive members, including but not limited to signal lines or pads on one layer and similar elements on another conductive layer. Examples include silver based conductive adhesive pastes available commercially under the trade name "Abelbond 8175" from Ablestick of Delhi, India, and under the trade name "CB100" from the E. I. duPont deNemours & Company. Another example of such a paste is sold under the trade name "DA-5915" by Engineered Materials Systems of Delaware, Ohio. "DA-5915" includes about eighty-eight percent by weight silver flakes and about twelve percent by weight of an anhydride epoxide as the organic binder, and is described as having a decomposition temperature of approximately 340 degrees C.

In FIG. 1, there is shown a circuitized substrate 11 in which a plurality of thru-holes 13, 15, 17, 19 and 21 are formed, each having a quantity of conductive paste 23 therein. Substrate 11 is meant to be of no particular construction other than to include at least two dielectric layers 25 and 27 (a third being layer 29) with a plurality of conductive layers 31, 33 and 35. Understandably, substrate 11 may include several more such thru-holes and conductive and dielectric layers, as represented by the example mentioned above. In one example, a total of 2500 thru-holes may be provided within a single rectangular dielectric layer having dimensions of about 52.5 millimeters (mm) wide by about 52.5 mm long, and a corresponding thickness of about 0.150 mm. This represents one example of the highly dense patterns which can be connected using the teachings herein. Further examples of other substrate cross-sectional configurations are illustrated in the aforementioned U.S. Pat. Nos. 6,809,269 and 6,828,514, assigned to the same Assignee as the present invention. These patents are thus incorporated herein by reference. The structure shown in FIG. 1 is thus not meant to limit the teachings of this invention.

The materials for the dielectric and conductive layers may be selected from those mentioned above, with copper or copper alloy the preferred metal for the layers 31, 33 and 35. A preferred dielectric material is the mentioned "RO2800" dielectric material from Rogers Corporation. Each conductive layer, which may include individual conductor elements as shown (i.e., layer 31 includes two illustrated conductors, layer 33 also is shown to include two, etc.), may be formed on the respective dielectric layer using the aforementioned photolithographic processing. The structure shown in FIG. 1 includes the illustrated three dielectric layers each with a conductive layer thereon, this structure preferably being formed by laminating the individual "sub-composites" together using conventional PCB lamination processes and equipment.

As stated, each of the thru-holes includes a conductive paste 23, which may be of one of the above cited products, although this also is not meant to limit the invention in that many other conductive pastes are satisfactorily usable in this invention. Each paste includes a metal component in the form of particles (such as flakes) of extremely small size. In one example, the paste may include silver particles each having a diameter of from only about one micron to about twenty microns. In such an example, each thru-hole may include approximately eight micrograms of such paste. Further, and as mentioned above, one or more of the thru-holes capable of having such paste as a conductive medium therein may also include conducting layers on the sidewalls thereof. Examples of such layers include copper or copper alloy plating. The thru-hole shown at the upper left of the substrate illustrates one having such internal layering. If such plating is desired, it may be accomplished using what is referred to as a "flash" plating, which is an electro-less plating operation. This operation is typically comprised of four steps: cleaning; activation; acceleration; and deposition. During the cleaning phase, organic contaminants, if present, are removed. The activation step includes a dip in a catalyst bath typically including hydrochloric acid and possibly tin or sodium chloride, and activation in a bath of hydrochloric acid, tin chloride and palladium chloride. The tin (Sn+2) ion reduces the palladium (Pd+2) to palladium, which is deposited on the internal walls. Remaining Sn+2 and Sn+4 are selectively removed by an accelerator such as fluoboric or sulfuric acid with hydrazine. Key elements of the electro-less copper chemistry include sodium hydroxide, formaldehyde, EDTA (or other chelater) and a copper salt. During the complex reaction with the palladium as a catalyst, the formaldehyde reduces the copper ions to metallic copper. Each resulting thin layer on the internal walls may have a thickness of only about 0.1 micron to 1.5 micron. In such a connection, both the thin metal layer and the conductive paste provide the necessary connection path between the respective two conductor members.

Although the above connections are defined as between spaced conductors in which a thru-hole is located between the conductors and includes conductive paste therein, this invention is not so limited. That is, the invention is also able to improve connections between two immediately adjacent pads or the like in which only a small quantity of paste is used. For example, it is possible to use paste between respective flat conductors on opposite sub-composites and bond the sub-composites together with the two flat conductors intended to be directly coupled to one another, using a small quantity of paste for this coupling. Therefore, the invention is not limited to only thru-hole type connections.

The circuitized substrate shown in the drawing is understood to be in condition suitable for having electrical components such as semiconductor chips or chip carriers positioned thereon and electrically coupled thereto, i.e., to the upper conductive layer 31. If substrate 11 is itself to function as a chip carrier, one or more such chips may be coupled to one surface thereof with the carrier adapted for being positioned on and coupled to another substrate such as a PCB, with connections to this other substrate possible using the substrate's lower conductive layer as shown. One known means of attaining such connections is to use solder balls of conventional tin:lead composition or the more recent lead-free solder compositions. These added components (PCB, chips, solder balls) are not shown because such components are well known in the art and such illustration is not necessary.

Prior to component positioning and coupling, it is of course necessary to test the various circuit paths and connections of substrate 11. As part of this effort, it is necessary to determine the resistance between the pairs of conductive members separated by dielectric layers in which the connection includes the conductive paste 23. Considering the thru-hole shown in the upper left of the drawing, for example, the resistance of the paste 23 in this thru-hole between the conductor member on the substrate's upper surface and the corresponding conductor located immediately below same (on the second layer 27) must be determined. If unsatisfactory, it was heretofore necessary to often scrap the entire substrate, an obviously costly result.

According to the teachings herein, a method is provided for improving the resistances of the conductive pastes which form connections in thru-holes such as shown in the drawing, should testing determine that such resistances are above the desired value. As stated, the invention is also able to improve paste connections between immediately adjacent conductors such as pads on different sub-composites brought together in a facing orientation. A thru-hole is not necessarily used between such paired conductors. Testing of these connections may be initially accomplished using conventional continuity testing methodology and equipment, to assign a respective resistance (in ohms) to each of the connections. Those exceeding an established level are next improved (reduced to the acceptable level) using the teachings herein.

Should the resistance across a pair of signal conductors exceed the established level, the first step of the invention involves the application of at least one (and preferably several) high voltage pulse(s) across the conductors (and, of course, through the interconnecting conductive paste). By way of example, should the resistance exceed fifty ohms, a high voltage pulse of from about one-hundred volts to about one-thousand volts may be applied, for a time period of from about ten milliseconds to about one-thousand milliseconds per pulse. A total of one-hundred pulses may be applied at this voltage level. In a more specific example, ten pulses at five-hundred volts each were applied for ten milliseconds per pulse. The result was the formation of arcs between some particles in the paste sufficiently to cause some fusing of the metallic (e.g., silver) particles thereof, thereby reducing the resistance to only from about one to about two ohms (in one specific example, to 1.7 ohms). Such arcing may not result in sintering of the metallic particles, but does result in an increase in the number of acceptable conductive paths through the paste. Thereafter, a second series of pulses, these of the high current type, are applied which will further heat the conductive paste, this time, significantly, to a temperature high enough to cause the paste to form a liquidus ball, meaning the paste forms a stable ball in liquid form. This is considered important to further create even more conductive paths through the paste than were achieved from the high voltage pulse application. With the several additional conductive paths formed across the paste interconnection as a result of this high current series of applications, the paste is now allowed to cool and assume its final position between the spaced conductive signal members. By a high current pulse as used herein is meant a pulse of from about one amp to about ten amps, and in one specific example, four amps. A total of from about one-hundred to about five-hundred of these high current pulses may be applied, over a time period of from about five-hundred milliseconds to about one-thousand milliseconds per pulse. In the specific example of applying four amps, each pulse was applied for five-hundred milliseconds.

Significantly, the resistance which is significantly reduced from the original high level to the much lower level following the high voltage series of pulse applications as measured following said high voltage pulse applications was not significantly reduced by application of the high current pulses. With an initial high resistance defect, it is first required to reduce the resistance of the circuit down to a lower value so as to be capable of passing higher currents. The high voltage pulse application(s) reduces the resistance from its higher value by arcing over the small gaps between adjacent conductors and within the conductive paste, thus forming more conductive paths between the two adjacent conductors. As stated, a series of high voltage pulses may be required to make more conductive connections. This higher conductivity connection will not be sintered, however, due to the lower resistance created. The "new" connection is now capable of higher current carrying capacity. The defined series of high current pulses through this new connection will now generate localized heating and thus sintering of the connection's conductive particles.

The amperage values during the high voltage applications used in the instant invention are less than those of the high current applications, while the voltages of the high current applications are less than the high voltages identified above. By way of example, the amperages of the high voltage pulse applications ranged from about 0.001 amps to about 0.02 amps while the voltages of the high current applications ranged from about one to about thirty volts during the high current applications. This is dependent on the initial resistance of the conductor after the high voltage pulse application.

As a result of the above method, it was possible to repair/improve the resistance levels of the connections which exceeded the required resistance levels needed for the tested substrate. In one example, a total of twenty-eight connections in one substrate were improved to a satisfactory level such that the substrate did not need to be scrapped. Significantly, this substrate included a total of seventy thousand connections using paste as a conductive medium. These twenty-eight improved connections were monitored over a period of about four months without any drift in the improved resistance values. The connections were also subjected to assembly simulation at 225 degrees C. (with three cycles) without any drift in the improved resistance values. In another example, a total of fourteen connections on three different organic chip carrier substrates, ranging from fourteen ohms to twenty-nine M-ohms were improved to from about 0.2 ohms to 1.2 ohms. These connections then were subjected to assembly simulation at 220 degrees C. (with 6 cycles-6×reflow) without any noticeable drift in the improved resistance values.

Thus there has been shown and described a method of repairing/improving conductive paste connections in a circuitized substrate which can be readily performed using conventional equipment used in the PCB art. The method as defined herein is able to adequately repair/improve the connections in substrates having several layers therein, e.g., those resulting from the lamination of various individual sub-composites or the like. It is also well within the scope of the invention to test such individual sub-composites (e.g., a substrate including at least two separate signal layers and an interim dielectric, e.g., one which may then serve as a "core" in a larger multilayered substrate when it is combined with other sub-composites, dielectric layers, and/or conductive layers) and perform repairs/improvements to the paste connections therein prior to subsequent bonding (e.g., lamination) to these other structures. The substrates and assemblies formed using the teachings of this invention are capable of transmitting both regular and high speed (frequency) signals, the latter at a rate of from about one gigabits/sec to about ten gigabits/second and more, while substantially preventing impedance disruption. As understood from the dimensions cited above, the invention is also able to repair/improve connections in highly dense circuitry of such substrates.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of improving an electrical connection within a circuitized substrate wherein said electrical connection includes conductive paste as a conductive medium, said method comprising:

applying at least one high voltage pulse, of from about one hundred volts to about one thousand volts given a resistance exceeding fifty ohms, across said conductive paste of said electrical connection; and applying at least one high current pulse, of from about one amp to about ten amps, across said conductive paste of said electrical connection, said high voltage and high current pulses being applied separately.

2. The method of claim 1, wherein said at least one high voltage pulse is applied prior to said applying said at least one high current pulse.

3. The method of claim 1, wherein said at least one high voltage pulse is applied for a time period less than the time period said at least one high current pulse is applied.

4. The method of claim 3, wherein said time period for applying said at least one high voltage pulse is from about ten milliseconds to about one-thousand milliseconds and said time period for applying said at least one high current pulse is from about five-hundred milliseconds to about one-thousand milliseconds.

5. The method of claim 1, wherein the amperage of said at least one high voltage pulse is less than the amperage of said at least one high current pulse.

6. The method of claim 5, wherein said amperage of said at least one high voltage pulse is from about 0.001 amps to about 0.02 amps.

7. The method of claim 1, wherein the voltage of said at least one high current pulse is lower than the voltage of said at least one high voltage pulse.

8. The method of claim 7, wherein said voltage of said at least one high current pulse is from about one volt to about thirty volts.

9. The method of claim 1, wherein said at least one high voltage pulse causes arcs to form between at least some of said conductive paste particles sufficiently to form more conductive paths through said conductive paste than were present prior to said applying of said at least one high voltage pulse.

10. The method of claim 9, wherein said at least one high current pulse heats said conductive paste sufficiently to form more conductive paths through said conductive paste than were formed following said application of said at least one high voltage pulse.

11. The method of claim 1, wherein said applying of said at least one high current pulse across said conductive paste of said electrical connection occurs following said applying of said at least one high voltage pulse across said conductive paste and is sufficient to heat said conductive paste so as to cause said conductive paste to form a liquidus ball.

12. The method of claim 1, wherein the number of said high voltage pulses is from one to about one hundred.

13. The method of claim 1, wherein the number of said high current pulses is from about one-hundred to about five-hundred.

14. The method of claim 1, wherein said conductive paste includes metallic particles as part thereof.

15. The method of claim 14, wherein said applying of said at least one high voltage pulse does not result in the sintering of said metallic particles of said conductive paste and said applying of said high current pulse does result in the sintering of at least some of said particles.

16. The method of claim 15, wherein said at least some of said metallic particles which are sintered from said applying of said high current pulse are silver particles.

* * * * *